United States Patent
Akita et al.

(10) Patent No.: US 7,915,635 B2
(45) Date of Patent: Mar. 29, 2011

(54) SEMICONDUCTOR LIGHT-EMITTING ELEMENT AND SUBSTRATE USED IN FORMATION OF THE SAME

(75) Inventors: Katsushi Akita, Itami (JP); Hitoshi Kasai, Itami (JP); Yoshiki Miura, Itami (JP); Kensaku Motoki, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 338 days.

(21) Appl. No.: 12/125,293

(22) Filed: May 22, 2008

(65) Prior Publication Data

US 2008/0296610 A1   Dec. 4, 2008

(30) Foreign Application Priority Data

May 30, 2007   (JP) .............................. P2007-143712

(51) Int. Cl.
*H01L 33/00* (2010.01)
(52) U.S. Cl. ................. 257/103; 257/190; 257/E33.043
(58) Field of Classification Search ................. 257/103, 257/190, E33.033, E33.034, E33.043
See application file for complete search history.

(56) References Cited

U.S. PATENT DOCUMENTS

2004/0262624 A1 *  12/2004   Akita et al. .................. 257/90

FOREIGN PATENT DOCUMENTS

JP   2003-183100   7/2003

OTHER PUBLICATIONS

Arpan Chakraborty et al., "Nonpolar InGaN/GaN emitters on reduced-defect lateral epitaxially overgrown a-plane GaN with drive-current-independent electroluminescence emission peak," Applied Physics Letters, Nov. 29, 2004, vol. 85, No. 22, pp. 5143-5145.
Kuniyoshi Okamoto, et al., "Dislocation-Free *m*-Plane InGaN/GaN Light-Emitting Diodes on *m*-Plane GaN Single Crystals," Japanese Journal of Applied Physics, 2006, vol. 45, No. 45, pp. L1197-L1199.

* cited by examiner

*Primary Examiner* — Minh-Loan T Tran
(74) *Attorney, Agent, or Firm* — Drinker Biddle & Reath LLP

(57) ABSTRACT

For a semiconductor laser, a stacked member comprising an active layer is formed on the surface of a GaN single-crystal substrate, a defect aggregation portion is formed on the rear face of the GaN single-crystal substrate, and an electrode is formed so as to be electrically connected to the defect aggregation portion on the rear face. The defect aggregation portion of this semiconductor laser has numerous crystal defects, and so the carrier concentration is high, and the electrical resistivity is lowered significantly. For this reason, in a semiconductor laser of this invention in which an electrode is formed on this defect aggregation portion, an Ohmic contact can easily be obtained between the GaN single-crystal substrate and the electrode, and by this means a lowered driving voltage is realized.

8 Claims, 6 Drawing Sheets

(a)

(b)

(c)

(a)

(b)

(c)

(a)

(b)

SEMICONDUCTOR LIGHT-EMITTING ELEMENT AND SUBSTRATE USED IN FORMATION OF THE SAME

BACKGROUND OF THE INVENTION

1. Field of the Invention

The present invention relates to a semiconductor light-emitting element and an element formation substrate used for such an element.

2. Related Background Art

In the prior art, GaN single-crystal substrates have been used in the manufacture of semiconductor lasers, light-emitting diodes, and other semiconductor light-emitting elements. For example, such methods are disclosed in Applied Physics Letters, Vol. 85, No. 22 (2004), p. 5143-5145, and in Japanese Journal of Applied Physics, Vol. 45, No. 45 (2006), p. L1197-L1199, which are non-patent references.

It is know that when the GaN single-crystal substrate has numerous crystal defects, there is degradation of the light emission intensity, element lifetime, and other characteristics of a semiconductor light-emitting element fabricated using the substrate. Hence the inventors presented, in Japanese Unexamined Patent Publication No. 2003-183100, a GaN single-crystal substrate grown on a c-plane, and manufacturing method thereof, in which defects are intentionally aggregated in one portion (a defect aggregation portion).

By means of such a GaN single-crystal substrate, the crystal defects in the remainder portions of the defect aggregation portions can be effectively reduced, and by using this low-defect portion, degradation of element characteristics due to crystal defects can be adequately suppressed.

SUMMARY OF THE INVENTION

As a result of further research, the inventors have newly discovered a technique enabling reduction of the operating voltage of semiconductor light-emitting elements.

That is, an object of this invention is to provide a semiconductor light-emitting element enabling reduction of the operating voltage, and an element formation substrate used for such an element.

In a semiconductor light-emitting element of this invention, a stacked member comprising an active layer is formed on a surface of a GaN single-crystal substrate, and a defect aggregation portion is formed on the rear face of the GaN single-crystal substrate, and moreover an electrode is formed so as to be electrically connected to the defect aggregation portion on the rear face.

In this semiconductor light-emitting element, a defect aggregation portion is formed on the rear face of a GaN single-crystal substrate. And, an electrode of the semiconductor light-emitting element is formed so as to be electrically connected to this defect aggregation portion. Because there are numerous crystal defects in this defect aggregation portion, the carrier concentration is high, and the electrical resistivity is lowered significantly. Hence in this semiconductor light-emitting element in which an electrode is formed on the defect aggregation portion, an Ohmic contact is easily achieved between the GaN single-crystal substrate and the electrode, and by this means the driving voltage is lowered.

Further, the GaN single-crystal substrate may also be an a-plane substrate, and the GaN single-crystal substrate may also be an m-plane substrate.

A substrate for element formation of this invention is used for formation of a semiconductor light-emitting element, and is a substrate for element formation comprising a GaN single crystal; a defect aggregation portion is formed on the face on which an electrode of the semiconductor light-emitting element is to be formed.

In this substrate for element formation, a defect aggregation portion is formed on the face on which an electrode of the semiconductor light-emitting element is to be formed. This defect aggregation portion has numerous crystal defects, so that the carrier concentration is high, and the electrical resistivity is lowered significantly. As a result, by forming an electrode of the semiconductor light-emitting element so as to be electrically connected to this defect aggregation portion, an Ohmic contact can easily be obtained between the GaN single-crystal substrate and the electrode, and by this means the driving voltage of the semiconductor light-emitting element can be lowered.

By means of this invention, a semiconductor light-emitting element enabling reduction of the operating voltage, and an element formation substrate used for such an element, are provided.

DESCRIPTION OF THE PREFERRED EMBODIMENTS

Below, aspects thought to be optimal when implementing the invention are explained in detail, referring to the attached drawings. Elements which are the same or equivalent are assigned the same symbols, and redundant explanations are omitted.

Figure 1:
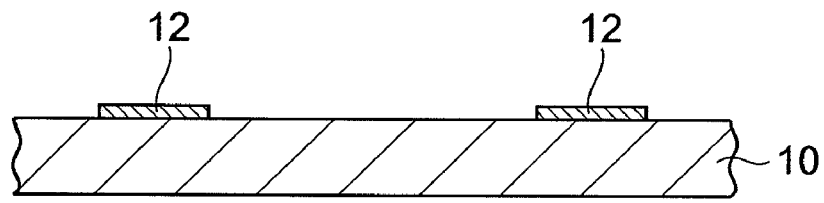
FIG. 1 shows a process of manufacture of a GaN single-crystal substrate in an aspect of the invention.
Figure 1:
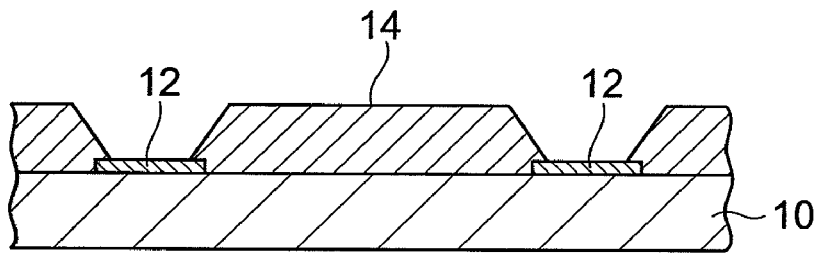
Figure 1:
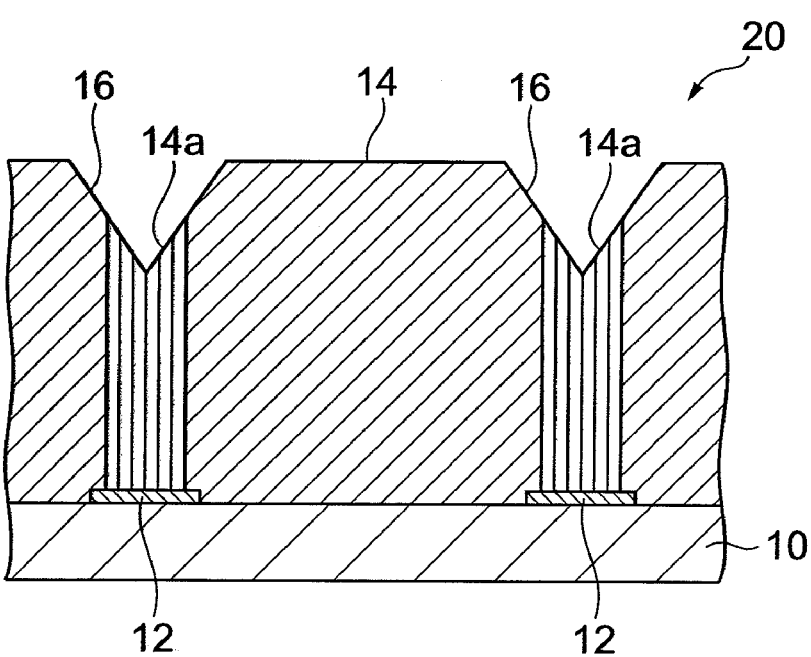

First, a procedure for manufacturing GaN single-crystal substrates used in manufacturing semiconductor light-emitting elements of this aspect of the invention is explained, referring to FIG. 1.

In fabricating the GaN single-crystal substrate, a prescribed single-crystal substrate 10 is used. As this single-crystal substrate 10, in addition to GaN substrate, a sapphire substrate, GaAs substrate, Si substrate, or similar, onto which a GaN epitaxial layer has been grown, can be used. The c-plane is exposed as the growth plane (surface) of this single-crystal substrate 10.

As shown in (a) of FIG. 1, a stripe-shape mask layer 12 is patterned and formed on the surface of the single-crystal substrate 10. The constituent material of this mask layer 12 can be selected appropriately from among $SiO_2$, SiN, Pt, W, and similar. The pattern of the mask layer 12 is that of a plurality of stripes of equal width, arranged at equal intervals extending in the <1-100> direction of the single-crystal substrate 10.

Then, as shown in (b) of FIG. 1, a GaN layer 14 is grown epitaxially on the single-crystal substrate 10 on which the mask layer 12 has been formed, by a vapor phase growth method. As the vapor phase growth method, the HVPE method, MOCVD method, VOC method, sublimation method, or similar can be used. Because the growth plane of the single-crystal substrate 10 is the c-plane, the c-plane of the GaN layer 14 grows in the c-axis direction. During epitaxial growth of the GaN layer 14, inclined faces comprising facets are formed in portions corresponding to the mask layer 12.

When the GaN layer 14 is grown to a greater film thickness, the mask layer 12 is covered by the GaN layer 14, and a GaN layer 14 is obtained in which trenches 16 and defect aggregation portions 14a are formed in portions corresponding to the mask layer 12. More specifically, defect aggregation portions 14a are formed in the bottoms of each of a plurality of trenches 16 extending in the <1-100> direction. These defect aggregation portions 14a are portions in which crystal defects (threading dislocations) in the GaN layer 14 are aggregated, and in which the defect density is markedly higher compared with other portions; for example, the defect density may be $1 \times 10^6$ cm$^{-1}$ or higher. The defects in these portions extend along the c-axis direction from the mask layer 12 to the bottoms of the trenches 16 in substantially the shape of straight lines.

Bulk crystal 20 obtained by thick-film growth of a GaN layer 14 on a single-crystal substrate 10 as described above is explained referring to FIG. 2.

As explained above, defect aggregation portions 14a are formed in portions corresponding to the mask layer 12. That is, in the mask layer 12, stripes are formed extending in the <1-100> direction, so that defect aggregation portions 14a corresponding to these stripes in the mask layer 12 also extended parallel to the a-plane in the <1-100> direction. Further, because in the mask layer 12 stripes of equal width are arranged in parallel at equal intervals, the defect aggregation portions 14a are also substantially of the same width, and are arranged intermittently at equal intervals, and low-defect portions 14b, with low defect densities, exist between the defect aggregation portions 14a.

As an example, the dimensions of the defect aggregation portions 14a may include a width W1 of 40 μm, and an interval therebetween (that is, width of low-defect portions 14b) W2 of 360 μm.

Figure 2:
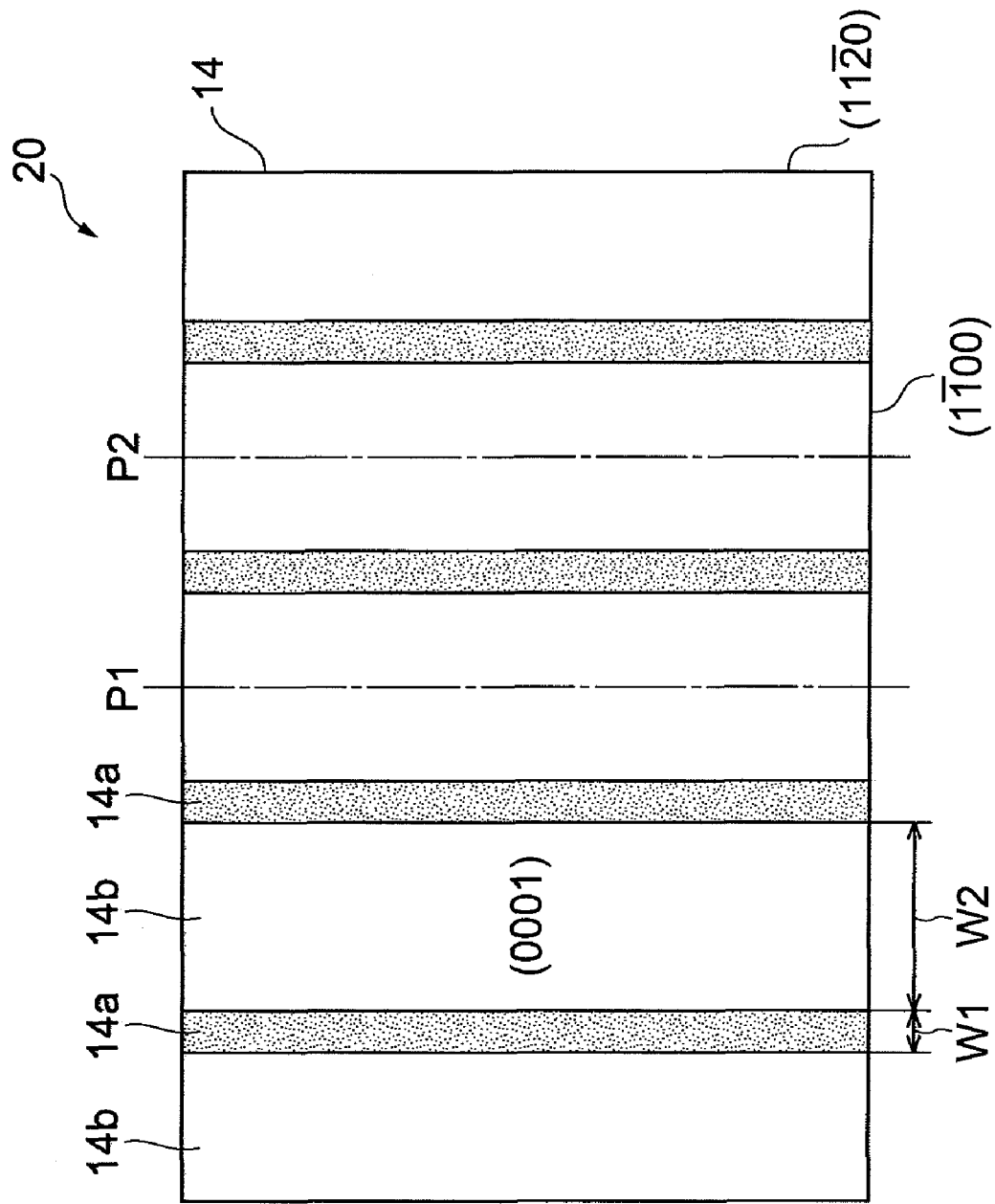
FIG. 2 is a plane view showing bulk crystal obtained by the process shown in FIG. 1.

The relation between crystal directions in the bulk crystal 20 is as shown in FIG. 2. That is, the upper plane of the bulk crystal 20 parallel to the plane of the paper is the (0001) plane (that is, the c-plane). The plane perpendicular to the c-plane and perpendicular to the defect aggregation portions 14a is the (1-100) plane (that is, the m-plane). And, the plane perpendicular to the c-plane and parallel to the defect aggregation portions 14a is the (11-20) plane (that is, the a-plane).

By slicing (vertically cutting) such a bulk crystal 20 parallel to the a-plane, GaN single-crystal substrate wafers are obtained. The thickness of the bulk crystal 20 is approximately 10 mm, and so the dimensions of a-plane substrates which can be cut away are for example 10 mm×50 mm. At this time, as shown in FIG. 2, cutting is performed at positions P1, P2 in low-defect portions 14b so as to surround one defect aggregation portion 14a. After cutting the bulk crystal 20 at these positions, a low-defect portion 14b on one side of the defect aggregation portion 14a is ground until the defect aggregation portion 14a is reached. By this means, a GaN single-crystal substrate 30 of the a-plane substrate, having a defect aggregation portion 14a with a high defect density on one side, and having on the other side a low-defect portion 14b with a low defect density, is obtained.

Figure 3:
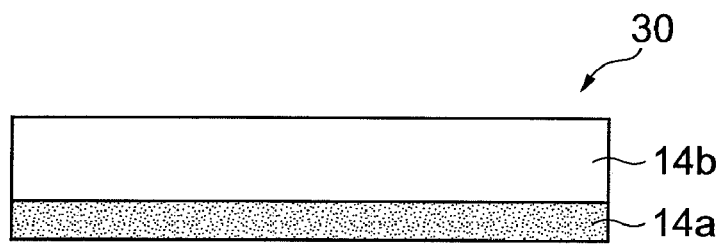
FIG. 3 shows a process of manufacture of a semiconductor laser in an aspect of the invention.
Figure 3:
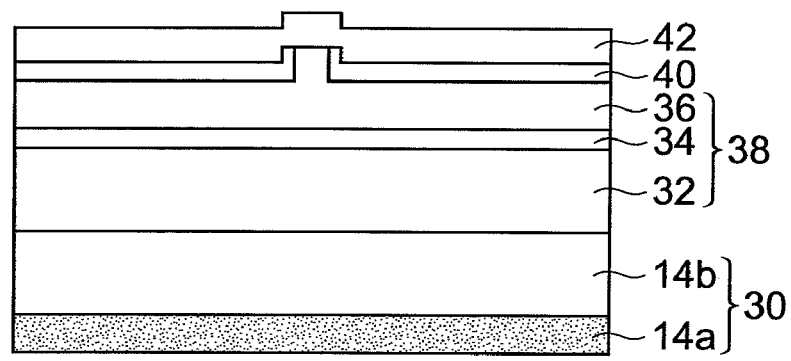
Figure 3:
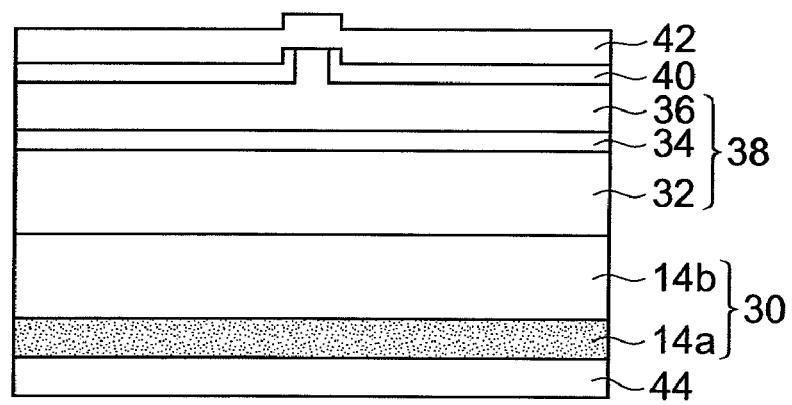

The procedure used to form a semiconductor light-emitting element on the GaN single-crystal substrate 30 for element formation obtained in this way is explained referring to FIG. 3.

When forming an element, first the above-described substrate 30 is set in a vapor phase growth device such that the face on the side of the low-defect portions 14b is the film growth face, as shown in (a) of FIG. 3.

Next, as shown in (b) of FIG. 3, a stacked member 38 comprising an n-type clad layer 32, active layer 34, and p-type clad layer 36 is deposited on the substrate 30, and an insulating layer 40 provided with an aperture portion is formed; then, a p-type electrode layer 42 is formed so as to cover this insulating layer 40.

Then, as shown in (c) of FIG. 3, an n-type electrode layer 44 is formed on the face on the side of the defect aggregation portions 14a of the substrate 30 so as to be electrically connected to the defect aggregation portions 14a.

Figure 4:
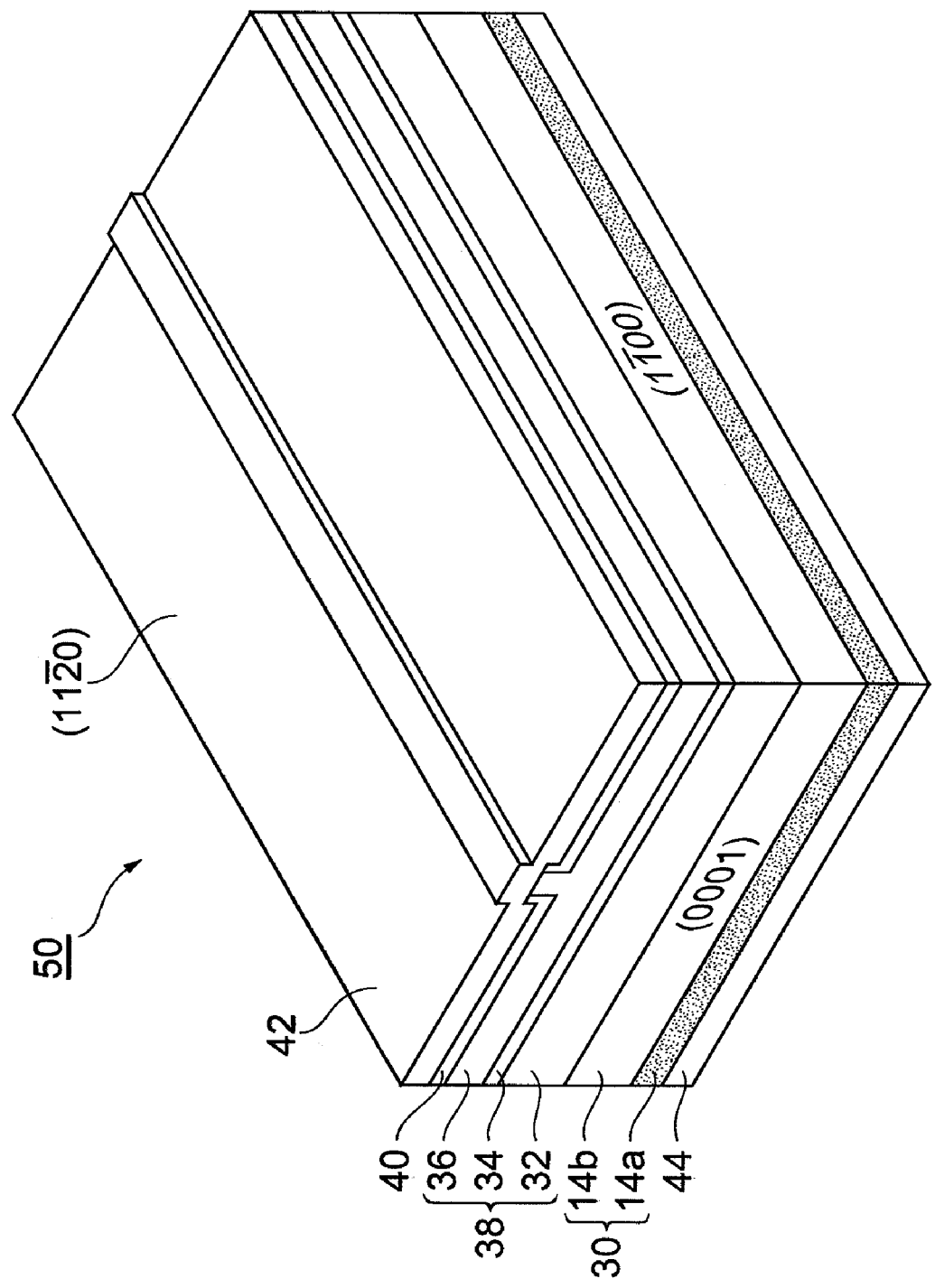
FIG. 4 is a perspective view showing a semiconductor layer obtained by the process shown in FIG. 3.

Finally, by cutting the substrate 30 with the element formed as above to obtain a chip, a semiconductor layer (semiconductor laser chip, semiconductor light-emitting element) 50 is obtained, as shown in FIG. 4.

The dimensions of this semiconductor laser 50 are for example approximately 200 to 400 μm in width, approximately 80 to 120 μm in height, and approximately 400 to 1000 μm in length. In the semiconductor laser 50, when cutting into a chip a cleaved face along a c-plane is obtained, and this face is used as the mirror face of a resonator.

As explained in detail above, in the method of manufacture of the semiconductor laser 50, the substrate 30 is formed by slicing such that the a-plane perpendicular to the c-plane is exposed. Hence this substrate 30 is not readily affected by threading dislocations extending parallel to the c-axis direction (<0001> direction), and so degradation of element characteristics by threading dislocations can be suppressed.

Further, because the a-plane of the substrate 30, which is the plane on which the element is formed, is a nonpolar plane, further improvement of light emission efficiency and longer wavelengths can be attained compared with cases in which elements are formed on the polar c-plane.

Moreover, on the surface of the substrate 30 in which defect aggregation portions 14a are formed, height differences tend to occur between defect aggregation portions 14a and remainder portions (low-defect portions) 14b, and degradation of element characteristics due to these height differences may occur. However, because a satisfactory flat face is obtained for a substrate 30 sliced such that the a-plane is exposed, such element characteristic degradation can be effectively avoided.

Hence by fabricating a semiconductor laser 50 using the above-described manufacturing method, further improvement of the element characteristics of the semiconductor laser 50 can be achieved.

As explained above, by using an a-plane substrate as a substrate for element formation, cleaving is possible at either a c-plane or at an m-plane, so that there is the advantage that cleaved faces can easily be obtained for use as mirror faces in a semiconductor laser resonator, and there is the advantage that machining into a rectangular shape is easy.

Figure 5:
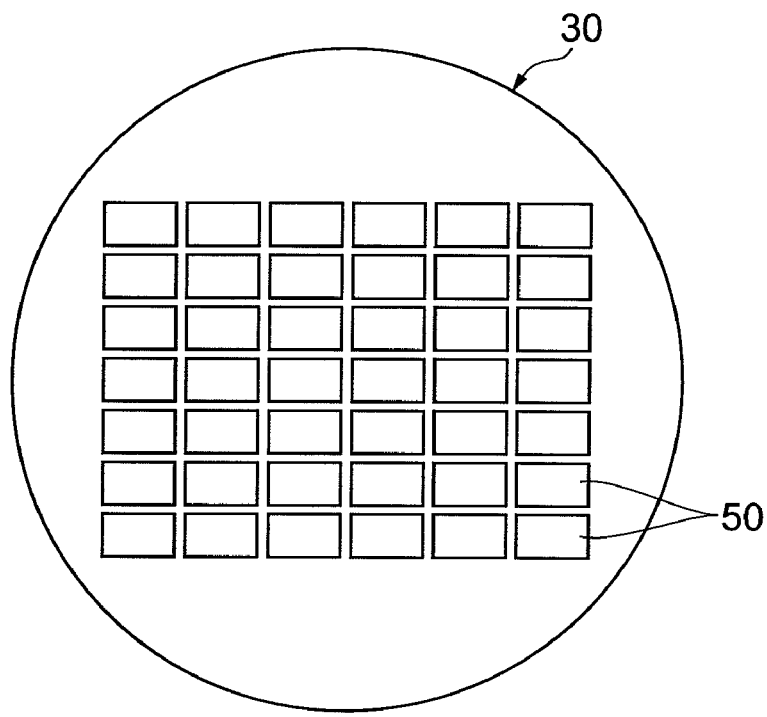
FIG. 5 shows the state of an element fabricated on a substrate.
Figure 5:
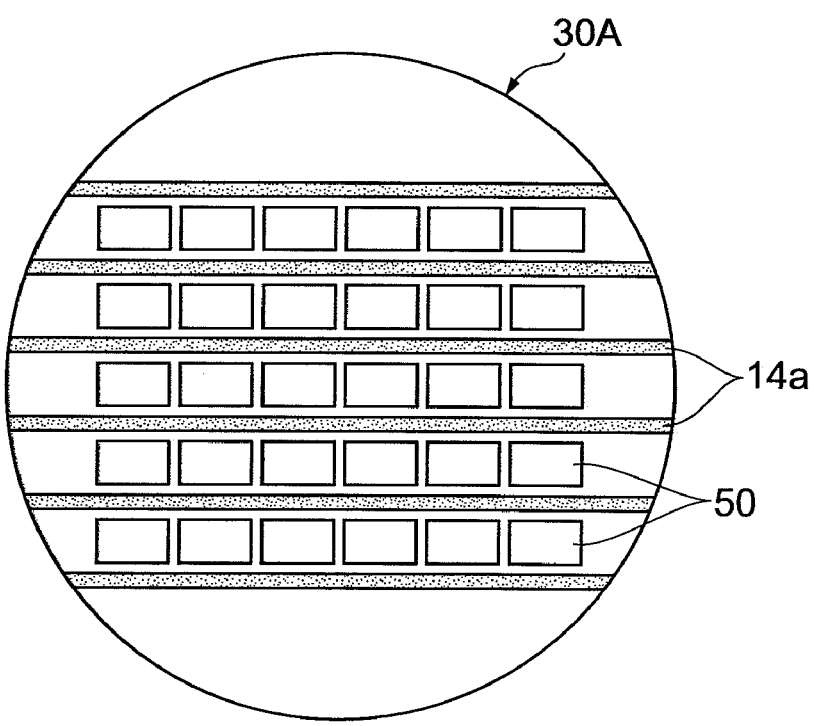

Further, as shown in (a) of FIG. 5, by slicing the bulk crystal 20 parallel to the a-plane, substrates 30 can be obtained in which the defect aggregation portions 14a are not exposed at the surface. Hence elements of the desired dimensions can be formed over the entire surface, without regard for the position of the defect aggregation portion 14a. When on the other hand the bulk crystal 20 is sliced parallel to the c-plane, as shown in (b) of FIG. 5, a substrate 30A results in which defect aggregation portions 14a are exposed at the surface, so that the need arises to form elements avoiding defect aggregation portions 14a, and consequently element dimensions are limited, and drops in manufacturing yields may occur.

In the above-described aspect, an explanation was given in which the bulk crystal 20 is sliced at positions P1 and P2 surrounding a defect aggregation portion 14a, and a substrate 30 was formed in which the defect aggregation portion is exposed at one surface. The defect aggregation portion 14a has numerous threading dislocations and so has a high concentration of carriers (oxygen), and the electrical resistivity is lowered significantly. More specifically, whereas the carrier concentration in low-defect portions 14b is of order $10^{17}$ to $10^{18}$, the concentration in defect aggregation portions 14a is one to two orders of magnitude higher. Hence by using a substrate 30 with a defect aggregation portion 14a exposed as a substrate for element formation, Ohmic contact between the substrate 30 and an electrode 44 is more easily achieved, and a semiconductor laser 50 with lowered operating voltage can be fabricated.

By this means, an element with an extended lifetime and reduced power consumption can be realized. In addition, because crystallinity is poorer in defect aggregation portions 14a compared with low-defect portions 14b, electrode materials can easily be fused, and there is greater freedom in choosing electrode materials and in the conditions for electrode formation.

This invention is not limited to the above aspects, and various modifications are possible. For example, in addition to semiconductor lasers, application to other elements (such as light-emitting diodes) is also possible.

Figure 6:
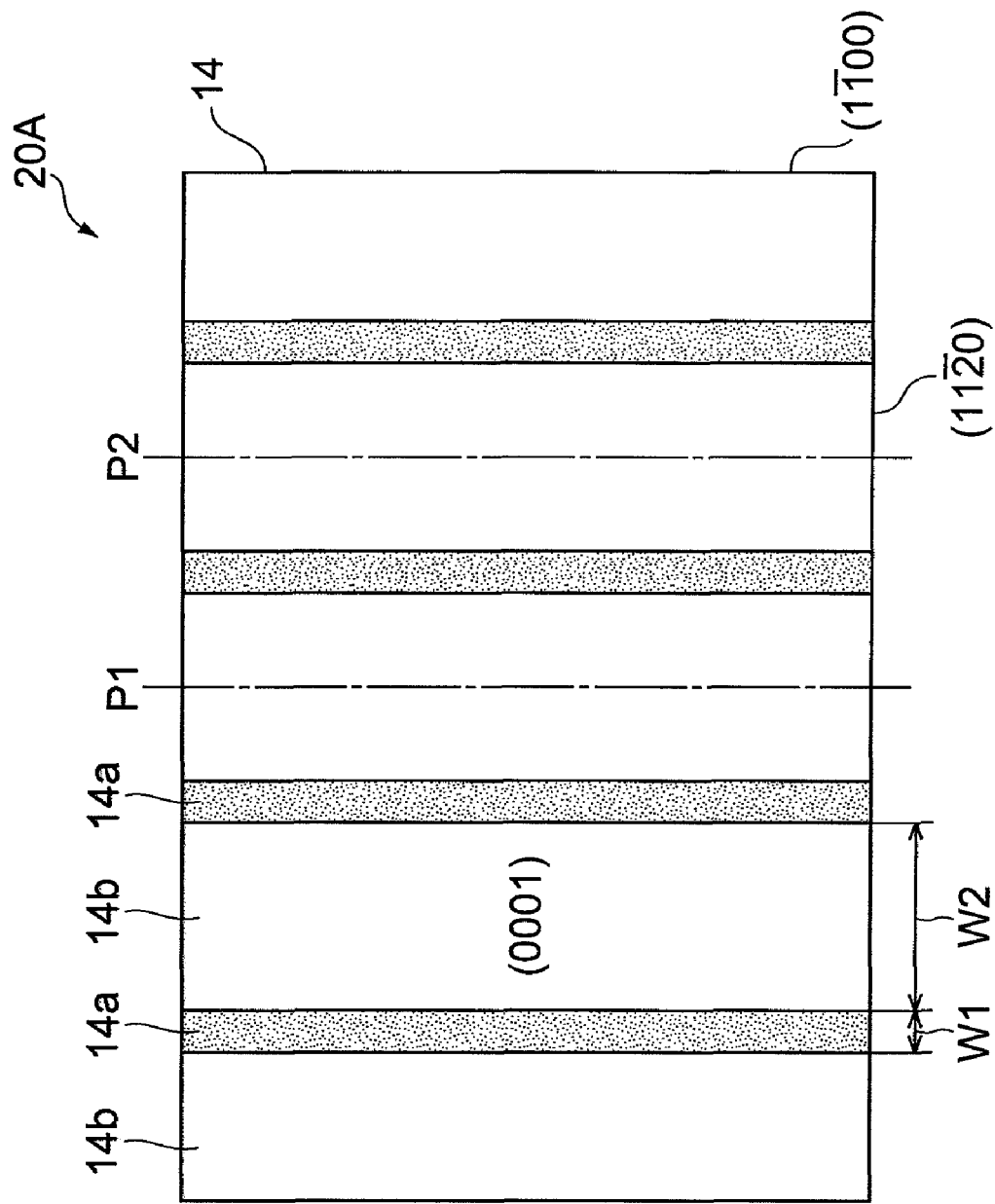
FIG. 6 is a plane view showing bulk crystal in a different aspect from FIG. 2.

Further, the GaN single-crystal substrate used is not limited to an a-plane substrate, but may be an m-plane substrate. In this case, the GaN single-crystal substrate for element formation is cut from bulk crystal 20A as shown in FIG. 6. In this bulk crystal 20A, defect aggregation portions 14a extending parallel to the m-plane along the <11-20> direction are formed using a mask layer extending in the <11-20> direction. The bulk crystal 20A is then sliced parallel to the m-plane to expose a defect aggregation portion 14a, and in this way a substrate similar to the above-described GaN single-crystal substrate 30 is obtained.

In cases in which such an m-plane substrate is used as well, advantageous results similar or equivalent to those when using the above-described a-plane substrate are obtained.

What is claimed is:

1. A semiconductor light-emitting element, wherein a stacked member comprising an active layer is formed on a surface of a GaN single-crystal substrate, a defect aggregation portion is formed on a rear face of the GaN single-crystal substrate along the rear face, and an electrode is formed so as to be electrically connected to the defect aggregation portion on the rear face.

2. The semiconductor light-emitting element according to claim 1, wherein the GaN single-crystal substrate is an a-plane substrate.

3. The semiconductor light-emitting element according to claim 1, wherein the GaN single-crystal substrate is an m-plane substrate.

4. A substrate for element formation, used in forming a semiconductor light-emitting element and comprising GaN single crystal, wherein a defect aggregation portion is formed on a face on which an electrode of the semiconductor light-emitting element is to be formed and the defect aggregation portion is formed along the face.

5. A semiconductor light-emitting element, wherein a stacked member comprising an active layer is formed on a surface of a GaN single-crystal substrate, a defect aggregation portion is formed on a rear face of the GaN single-crystal substrate, the defect aggregation portion is not exposed to the surface and an electrode is formed so as to be electrically connected to the defect aggregation portion on the rear face.

6. The semiconductor light-emitting element according to claim 5, wherein the GaN single-crystal substrate is an a-plane substrate.

7. The semiconductor light-emitting element according to claim 5, wherein the GaN single-crystal substrate is an m-plane substrate.

8. A substrate for element formation, used in forming a semiconductor light-emitting element and comprising GaN single crystal, wherein a defect aggregation portion is formed on a face on which an electrode of the semiconductor light-emitting element is to be formed and the defect aggregation portion is not exposed to a face opposite to the face on which the electrode is to be formed.

* * * * *